US012395135B2

(12) United States Patent
Samelis

(10) Patent No.: US 12,395,135 B2
(45) Date of Patent: Aug. 19, 2025

(54) LOAD INSENSITIVE POWER DETECTION

(71) Applicant: Skyworks Solutions, Inc., Irvine, CA (US)

(72) Inventor: Apostolos Samelis, Bishop's Stortford (GB)

(73) Assignee: Skyworks Solutions, Inc., Irvine, CA (US)

( * ) Notice: Subject to any disclaimer, the term of this patent is extended or adjusted under 35 U.S.C. 154(b) by 60 days.

(21) Appl. No.: 18/321,668

(22) Filed: May 22, 2023

(65) Prior Publication Data

US 2023/0318541 A1  Oct. 5, 2023

Related U.S. Application Data

(63) Continuation of application No. 17/133,292, filed on Dec. 23, 2020, now Pat. No. 11,689,163.

(Continued)

(51) Int. Cl.
*H03G 3/30* (2006.01)
*H03F 1/02* (2006.01)
(Continued)

(52) U.S. Cl.
CPC .......... *H03F 3/195* (2013.01); *H03F 1/0238* (2013.01); *H03F 3/245* (2013.01);
(Continued)

(58) Field of Classification Search
CPC ....................................................... H03G 3/30
(Continued)

(56) References Cited

U.S. PATENT DOCUMENTS 2,912,573 A * 11/1959 Mitchell ................ H03G 3/344
455/212
3,487,325 A * 12/1969 Klockow ................ H03F 1/347
330/196

(Continued)

OTHER PUBLICATIONS

K. Kurokawa, Power Waves and the Scattering Matrix, 1965, pp. 194-202, Murray Hill, N.J.

*Primary Examiner* — Henry Choe
(74) *Attorney, Agent, or Firm* — Knobbe, Martens, Olson & Bear, LLP

(57) ABSTRACT

A load-insensitive power amplifier power detector that excludes the use of couplers is disclosed. The load-insensitive power amplifier power detector may include a voltage sampling circuit in electrical communication with a collector of a power amplifier and configured to sample a first voltage from the power amplifier. The load-insensitive power amplifier power detector may include a current sampling circuit in electrical communication with the collector of the power amplifier and configured to sample an output current from the power amplifier. Further, the load-insensitive power amplifier power detector may include a current-to-voltage converter connected between the voltage sampling circuit and an output of the load-insensitive power amplifier power detector. The current-to-voltage converter may be configured to convert the output current to obtain a second voltage. Moreover, a combination of the first voltage and the second voltage may form a detector voltage corresponding to an incident power of the power amplifier.

20 Claims, 14 Drawing Sheets

Related U.S. Application Data

(60) Provisional application No. 62/955,755, filed on Dec. 31, 2019.

(51) Int. Cl.
*H03F 3/195* (2006.01)
*H03F 3/24* (2006.01)

(52) U.S. Cl.
CPC .............. *H03F 2200/105* (2013.01); *H03F 2200/318* (2013.01); *H03F 2200/451* (2013.01); *H03F 2200/541* (2013.01)

(58) Field of Classification Search
USPC .................................................. 330/278, 279
See application file for complete search history.

(56) References Cited

U.S. PATENT DOCUMENTS

| | | | |
|---|---|---|---|
| 3,648,188 A | | 3/1972 | Ratcliff |
| 4,042,887 A | * | 8/1977 | Mead ..................... H03F 1/345 |
| | | | 333/131 |
| 4,065,723 A | | 12/1977 | Endres et al. |
| 4,994,761 A | | 2/1991 | Craft |
| 5,406,226 A | | 4/1995 | Cioffi et al. |
| 5,726,606 A | | 3/1998 | Marland |
| 11,689,163 B2 | | 6/2023 | Samelis |

\* cited by examiner

DH5 3:1 LP CIRCLE, CONST Vdet, 19.5 dBm (NOM)

| Pout | 2402 | 2441 | 2480 | MAX |
|------|------|------|------|-----|
| MAX | 20.171 | 20.206 | 20.244 | |
| MIN | 18.903 | 18.773 | 18.632 | |
| MEAN | 19.537 | 19.4895 | 19.438 | |
| DELTA | 1.27 | 1.43 | 1.61 | 1.61 |
| +/− | 0.63 | 0.72 | 0.81 | 0.81 |

LOAD INSENSITIVE POWER DETECTION

INCORPORATION BY REFERENCE TO ANY PRIORITY APPLICATIONS

This application is a continuation of U.S. application Ser. No. 17/133,292, filed on Dec. 23, 2020 and titled "LOAD INSENSITIVE POWER DETECTION," the disclosure of which is hereby incorporated by reference in its entirety for all purposes, and which claims priority to U.S. Provisional Application No. 62/955,755, filed on Dec. 31, 2019 and titled "LOAD INSENSITIVE POWER DETECTION," the disclosure of which is hereby incorporated by reference in its entirety for all purposes. Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to a power detector.

Description of the Related Art

It is often desirable to determine a power output of a circuit. For example, in some cases it is desirable to modify a power supplied to a circuit based on a detected power output of the circuit. For instance, power detection of a power amplifier circuit may be used to adjust the input voltage supplied to the power amplifier circuit. Thus, some devices that incorporate a power amplifier circuit may also include a power detector that can measure an output power value and can adjust the supplied input power or voltage. However, the added power detector can have large area requirements, which is at odds with a desire to shrink circuits and devices. Thus, it is desirable to reduce the size of the power detector to facilitate device size reduction.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a load-insensitive power amplifier power detector that excludes the use of couplers. The load-insensitive power amplifier power detector may include a voltage sampling circuit in electrical communication with a collector of a power amplifier and configured to sample a first voltage from the power amplifier. Further, the load-insensitive power amplifier power detector may include a current sampling circuit in electrical communication with the collector of the power amplifier and configured to sample an output current from the power amplifier. In addition, the load-insensitive power amplifier power detector may include a current-to-voltage converter connected between the voltage sampling circuit and an output of the load-insensitive power amplifier power detector. The current-to-voltage converter may be configured to convert the output current to obtain a second voltage. Moreover, a combination of the first voltage and the second voltage may form a detector voltage corresponding to an incident power of the power amplifier.

In some implementations, the current sampling circuit includes a portion of an output matching network connected to the collector of the power amplifier. Further, the current sampling circuit may include a transformer. The transformer may be formed from a first inductor of an output matching network that is aligned with a second inductor that is separate from the output matching network. In addition, the voltage sampling circuit may include a voltage sampler configured to sample a third voltage and a phase shifter configured to adjust a phase of the third voltage to obtain the first voltage. The phase shifter may adjust the phase of the third voltage to match a phase of the second voltage. In some cases, the detector voltage is a load-insensitive voltage. Further, in some implementations, the power amplifier is a multi-stage power amplifier and the collector is a collector of the output stage of the power amplifier.

Additional aspects of the present disclosure relate to a front-end module. The front-end module may include a power amplifier configured to amplify a signal received from a transceiver. Further, the front-end module may include a power detector. The power detector may be configured to detect an incident power of the power amplifier. Further, the power detector may include a voltage sampling circuit, a current sampling circuit, and a current-to-voltage converter. The voltage sampling circuit may be configured to sample a first voltage from a collector of the power amplifier. The current sampling circuit may be configured to sample an output current from the power amplifier. The current-to-voltage converter may be configured to convert the output current to obtain a second voltage. A combination of the first voltage and the second voltage may form a detector voltage corresponding to the incident power of the power amplifier.

In certain implementations, the front-end module may further include an output matching network configured to match an impedance of the power amplifier to an antenna impedance. A portion of the current sampling circuit may be formed from a portion of the output matching network. Further, the current sampling circuit may include a transformer. A first inductor of the transformer may be included in the output matching network while a second inductor of the transformer may be separate from or not included as part of the output matching network. In addition, the voltage sampling circuit may include a voltage sampler configured to sample a third voltage and a phase shifter configured to adjust a phase of the third voltage to obtain the first voltage. The phase shifter can adjust the phase of the third voltage to match a phase of the second voltage. In some cases, the detector voltage is independent of a load on the power amplifier.

Some aspects of the present disclosure relate to a wireless device. The wireless device may include an antenna configured to transmit a signal received from a power amplifier. Further, the wireless device may include a front-end module in electrical communication with the antenna. The front-end module may include the power amplifier and a power detector. The power detector may include a voltage sampling circuit, a current sampling circuit, and a current-to-voltage converter. The voltage sampling circuit may be configured to sample a first voltage from a collector of the power amplifier. The current sampling circuit may be configured to sample an output current from the power amplifier. In addition, the current-to-voltage converter may be configured to convert the output current to obtain a second voltage. A combination of the first voltage and the second voltage may form a detector voltage corresponding to an incident power of the power amplifier.

In some implementations, the wireless device may further include a controller configured to cause a transceiver to modify a radio frequency signal provided to the power amplifier based at least in part on the detector voltage. Moreover, the front-end module may include an output matching network configured to match an impedance of the power amplifier to an antenna impedance of the antenna. Further, the current sampling circuit may include a transformer formed in part from an inductor of the output matching network. In some cases, the voltage sampling circuit may include a phase shifter configured to match a phase of the first voltage to a phase of the second voltage.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 13B presents a table of measured values obtained during testing of the prototype power detector.

DETAILED DESCRIPTION

Figure 1:
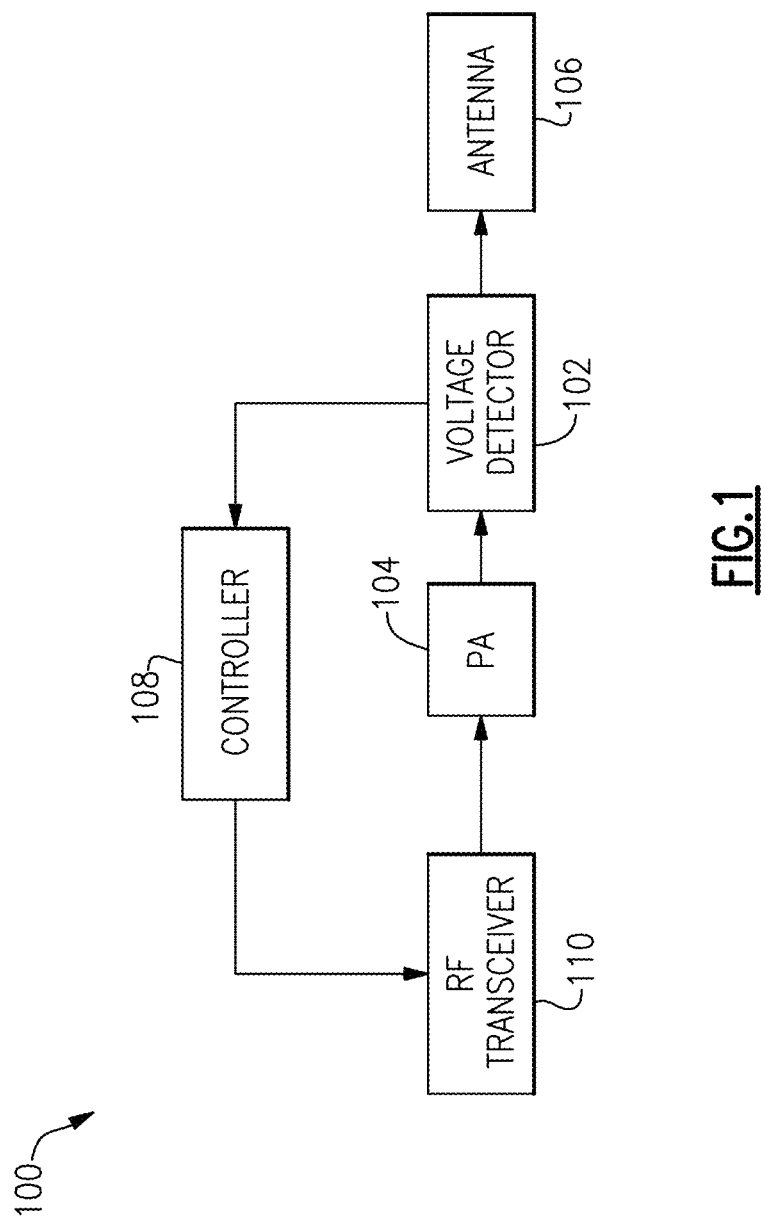
FIG. 1 presents a block diagram of one example of a portion of a wireless device with a voltage detector.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In this description, references to "an embodiment," "one embodiment," or the like, mean that the particular feature, function, structure or characteristic being described is included in at least one embodiment of the technique introduced herein. Occurrences of such phrases in this specification do not necessarily all refer to the same embodiment. On the other hand, the embodiments referred to are also not necessarily mutually exclusive.

INTRODUCTION

An amount of power required for a wireless device to communicate with a target (e.g., a base station) may vary based on a number of factors. One of these factors is the load impedance at the output of a power amplifier or at the antenna during transmission of a signal. The load impedance often varies due to the surrounding environment of the wireless device. For example, when the wireless device is within a car or a building, the impedance at the antenna may be different than when the wireless device is located within an open space. The impedance may affect the amount of power output by the wireless device. For at least this reason, it is often the case that the power of a signal emitted by a power amplifier or antenna does not match the intended or desired signal power. Thus, it is often desirable for a wireless device to determine an actual power output of the power amplifier. Using the detected power output by the power amplifier, it is possible to adjust the output power of the power amplifier.

FIG. 1 illustrates one example of a portion of a wireless device 100 that includes a feedback loop for adjusting a signal provided to a power amplifier based on a detected voltage. As power may be determined by a combination of voltage and current, the detected voltage may correspond to a power output. As illustrated, a voltage detector 102 may be positioned between a power amplifier 104 and an antenna 106. In some cases, the voltage detector 102 may be replaced by a current detector. The load on the antenna 106, or the output load on the power amplifier 104, may affect the power output by the power amplifier 104. The voltage detector 102 may be used to measure an output voltage of the power amplifier 104. The output of the voltage detector 102 may be provided to a controller 108, which may cause the radio frequency (RF) transceiver 110 to modify the signal supplied to the power amplifier 104 based at least in part on the output of the voltage detector 102.

Figure 2A:
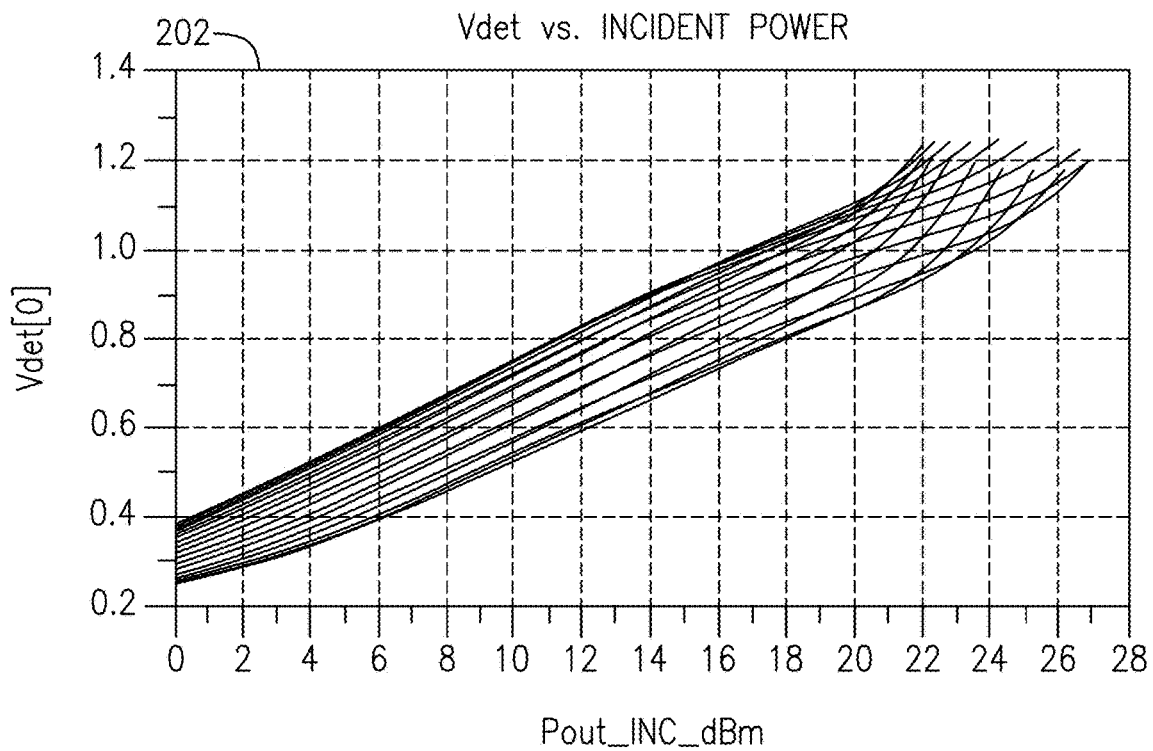
FIG. 2A illustrates the output power of a power amplifier versus a voltage detector signal.
Figure 2B:
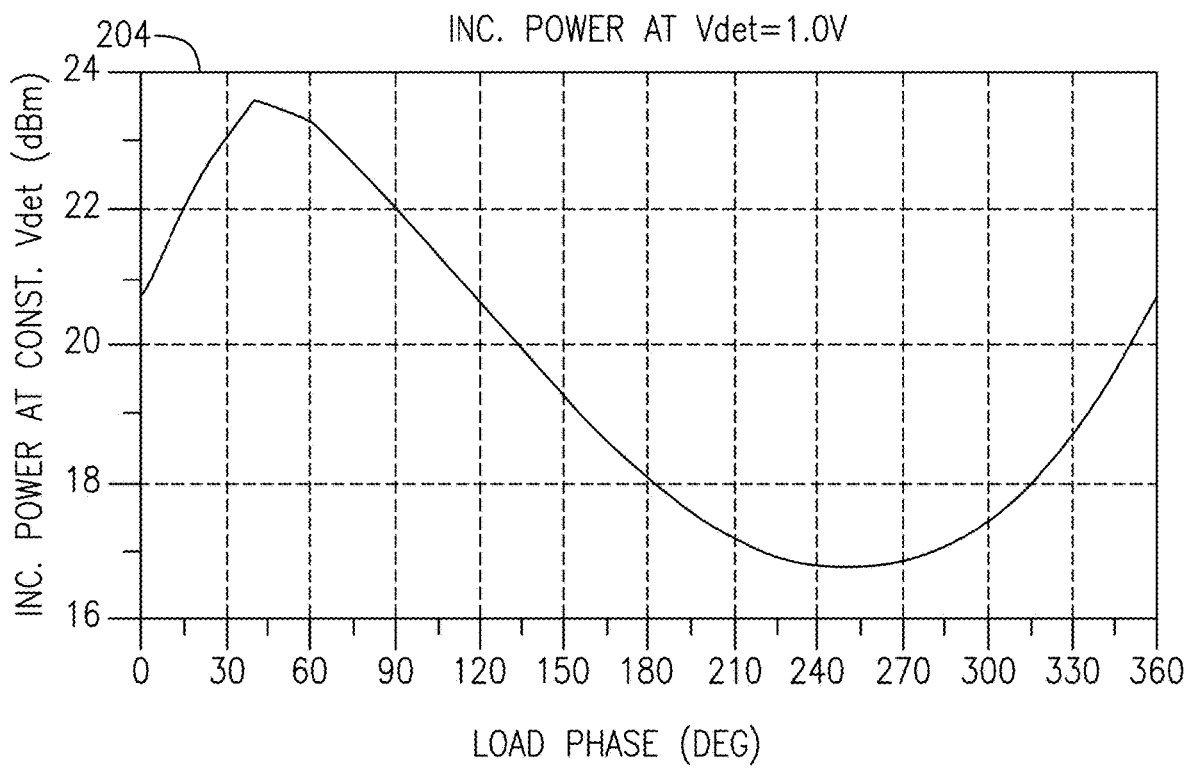
FIG. 2B illustrates, for a given voltage detector value, incident power of a power amplifier at different load phases.

Certain power detection techniques are sensitive to the load of the power amplifier 104. Thus, in some cases, the ability to adjust the power output of the power amplifier based on a detected power, or detected voltage, is limited because the accuracy of the voltage detector 102 is limited. For example, FIG. 2A illustrates the output power of a power amplifier versus the voltage detector signal. As the output voltage increases, the voltage detector signal increases. However, the load of the power amplifier may affect the output of the voltage detector implemented using conventional techniques. This impact of load on the voltage detector output is illustrated by the plurality of curves in FIG. 2A. The graph 202 shows a set of curves of the detected power (Vdet) vs. the incident output power (Pout_inc_dBm). Each curve corresponds to a different load presented to a power amplifier. Each load is defined by the magnitude and phase of the reflection coefficient by which the load is represented. In the illustrated example, the magnitude is constant for each of the curves and the phase is varied in 19 steps, from 0 to 360 degrees. It can be observed that the detected power is dependent not only on the incident power but also on the phase of the load. As illustrated in FIG. 2A, different loads result in different values for the voltage detector for the same power amplifier output. FIG. 2B illustrates the impact of the load on the voltage detector from another perspective. FIG. 2B illustrates that, for a given voltage detector value, Vdet=1.0V, the output power of the power amplifier may vary based on the load. A horizontal line drawn at Vdet=1 in the graph 202 of FIG. 2A would intersect the set of Vdet curves at exactly 19 points (corresponding to the number of curves). Each point is uniquely defined by a load phase and an incident power. The graph 204 of FIG. 2B shows these points, or the incident power vs. the load phase at Vdet=1V.

Thus, as illustrated by FIGS. 2A and 2B, it is difficult with existing power detectors to accurately determine the power being emitted by a power amplifier under different load conditions. It is therefore desirable to detect or measure output power of the power amplifier in a way that is load independent.

One solution for load-independent power detection is to use coupler circuits that include directional couplers. However, directional couplers are usually not cost effective and require a relatively significant amount of silicon or chip area within a front-end module. The use of directional couplers for power detection is thus counter to the general desire to shrink or not increase the size of wireless devices.

Certain aspects of the present disclosure relate to a load-independent power detector that provides improved power detection over conventional techniques and is smaller than other power detection circuits. Certain power detectors disclosed herein avoid the use of couplers enabling the power detector to be shrunk compared to power detectors that use directional couplers. Further, the power detectors disclosed herein have been shown to have at least a four times improvement in measurement accuracy over other power detectors.

Power detectors disclosed herein are capable of determining an incident output power of a power amplifier. In some cases, the power detector determines a voltage value that corresponds to an incident output power. Based on the determined voltage value, a controller can modify a radio frequency (RF) signal provided by a transceiver to the power amplifier.

The power detector may include a voltage sensor or detector configured to measure an output voltage of a collector of an output stage of a power amplifier. Further, the power detector may include a current sensor that can determine an output current of the output of the power amplifier. This sensed output current can be converted to a voltage that can be combined with the output voltage of the collector to determine a load-independent voltage value for the power amplifier.

Example Wireless Device

Figure 3:
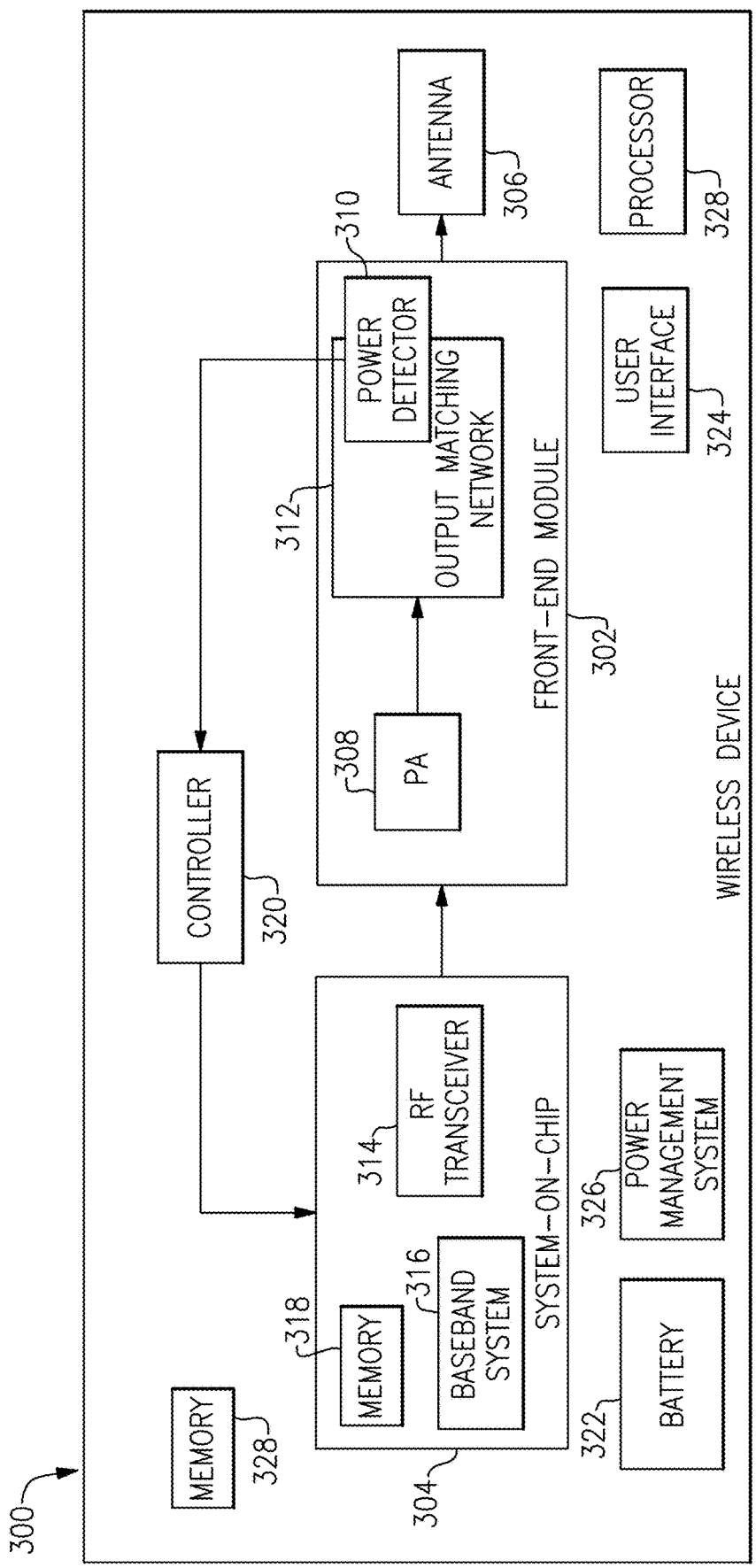
FIG. 3 illustrates a block diagram of a wireless device that includes a power detector in accordance with certain aspects of the present disclosure.

FIG. 3 illustrates a block diagram of a wireless device 300 that includes a power detector 310 in accordance with certain aspects of the present disclosure. The wireless device 300 may include any type of wireless device that is configured to receive and transmit wireless signals. In some cases, the wireless device 300 may include any type of wireless devices capable of processing a plurality of wireless signals using a plurality of technologies, communication standards, or features of the wireless device 300. For example, the wireless device 300 may be a cellular phone (including a smart phone or a dumb phone), a tablet device, a laptop, a smartwatch, a pair of smart glasses, or any other wearable device, internet-of-things (IOT) device, or computing device that may include wireless and/or cellular communication capability. Further, the wireless device 300 may use one or more different communication technologies. For example, the wireless device 300 may be capable of 4G LTE, 5G, Bluetooth®, near-field Communication (NFC), Wi-Fi®, or any other number or type of communication.

The example wireless device 300 illustrated in FIG. 3 includes a number of elements as described herein. However, it should be understood that the wireless device 300 may be configured differently and may include more or fewer devices or elements.

The wireless device 300 includes a front-end module 302 between a system-on-chip (SoC) 304 and an antenna 306. The front-end module 302 may include one or more circuit elements that facilitate communication or emission of a radio frequency signal, received from the SoC 304, over an antenna 306 to one or more other devices, such as a base station. Further, the front-end module 302 may facilitate processing of a signal received from the antenna 306. For example, the front-end module 302 may amplify a signal for transmission and direct the amplified signal to one or more antennas 306 of the wireless device 300 based on a control signal and/or frequency of the RF signal for transmission. As another example, the front-end module 302 may filter and direct a signal received from the antenna 306 to one or more communication paths of a transceiver.

As indicated above, the front-end module 302 may receive an RF signal from the SoC 304 for transmission. This RF signal may be received from the RF transceiver 314 of the SoC 304. The front-end module 302 may include a power amplifier 308 that can amplify the received RF signal before it is emitted over the antenna 306. The amount of amplification, or the desired signal power for the RF signal, may depend on a number of factors. For example, the distance of the wireless device 300 from a base station, the ambient environment of the wireless device 300 (e.g., within a building or a car), or the particular communication frequency may affect the desired signal strength. Further, the load at the output of the power amplifier 308 may vary based on the ambient condition of the wireless device 300. Thus, as previously described, it is desirable to accurately detect the output power of the PA 308 to enable the power of the RF signal to be accurately adjusted. When the power of the PA 308 is inaccurate, the signal strength may be insufficient resulting in a reduction in the communication range of the wireless device 300. On the other hand, when the signal strength is greater than necessary, the battery life of the battery 322 may be reduced both for a single charge and over the life of the battery 322.

To measure the actual output power of the PA 308, and consequently enable the power supplied to the PA 308 to be modified, the front-end module 302 includes a power detector 310. The power detector 310 is capable of more accurately measuring the output power of the PA 308 compared to existing detectors and is smaller than coupler-based detectors.

The front-end module 302 may further include an output matching network 312 that is configured to match the impedance between the PA 308 and the antenna 306. This output matching network 312 may include any type of impedance matching network. For example, the output matching network 312 may include a dynamic or switch-based impedance matching network.

As illustrated by the partially overlapping boxes of the power detector 310 and the output matching network 312, in some implementations, at least a portion of the output matching network 312 may be included as part of the power detector 310 (or vice-versa). For example, as described in more detail below, the power detector 310 may share an inductor circuit element with the output matching network 312. By sharing circuit elements, the size of the power detector 310 may be further reduced compared to other power detector implementations.

The power detector 310 may supply a power detector signal to the controller 320. The power detector signal may be an electrical signal (e.g., a voltage or a current) that is indicative of the output power of the PA 308, or the RF signal output by the PA 308. In some cases, this detector signal output by the power detector 310 may represent the RF signal output by the PA 308. In other cases, the detector signal may not directly represent the RF signal output, but may be a signal (e.g., a voltage signal) that correspond to the RF signal output power that is output by the PA 308. The controller 320 may determine the signal strength of the RF signal output by the PA 308 based on the power detector signal. The controller 320 may determine the RF signal strength by accessing a lookup table or other data structure that indicates a correspondence between power detector signal measurements and RF signal strengths. Using the determination of the RF signal strength, the controller 320 may cause the SoC 304 to modify the signal strength of the signal supplied by the RF transceiver 314 to the PA 308. Alternatively, or in addition, the controller 320 may cause the configuration of the PA 308 to be modified to adjust the signal strength of the RF signal output by the PA 308 for emission by the antenna 306.

The RF signal provided by the transceiver 314 to the PA 308 may be obtained from the baseband system 316. The baseband system 316 may communicate with a user interface 324 to facilitate processing of various user input and output (I/O), such as voice and data. The baseband system 316 provides the transceiver 314 with digital representations of transmit signals, which the transceiver 314 processes to generate RF signals for transmission. The baseband system 316 also processes digital representations of received signals provided by the transceiver 314. As shown in FIG. 3, the wireless device may further include a memory 318 and/or 328. The baseband system 316 may be coupled with or communicate with the memory 318 and/or 328 to facilitate operation of the wireless device 300. The memory 318, 328 can be used for a wide variety of purposes, such as storing data and/or instructions to facilitate the operation of the wireless device 300 and/or to provide storage of user information.

The power management system 326 provides a number of power management functions of the wireless device 300. In certain implementations, the power management system 326 includes a PA supply control circuit that controls the supply voltages of the power amplifier 308. For example, the power management system 326 can be configured to change the supply voltage(s) provided to one or more the power amplifiers 308 to improve efficiency, such as power added efficiency (PAE). The power management system 326 can receive a battery voltage from a battery 322, or other power supply (e.g., a mains power supply). The battery 322 can be any suitable battery for use in the wireless device 300, including, for example, a lithium-ion battery.

Further, the wireless device 300 may include a processor 328 that may serve as a central processing unit for executing an operating system and applications on the wireless device 300. This processor 328 may interact with the user interface 324 to obtain input and to display output to a user. In some cases, the processor 328 may be part of the SoC 304 and may facilitate processing voice and data. The processor 328 may facilitate providing digital representations of data to the RF transceiver 314 for transmission. In some cases, the processor 328 is omitted or is the SoC 304.

Example Power Detector Circuit

Figure 4:
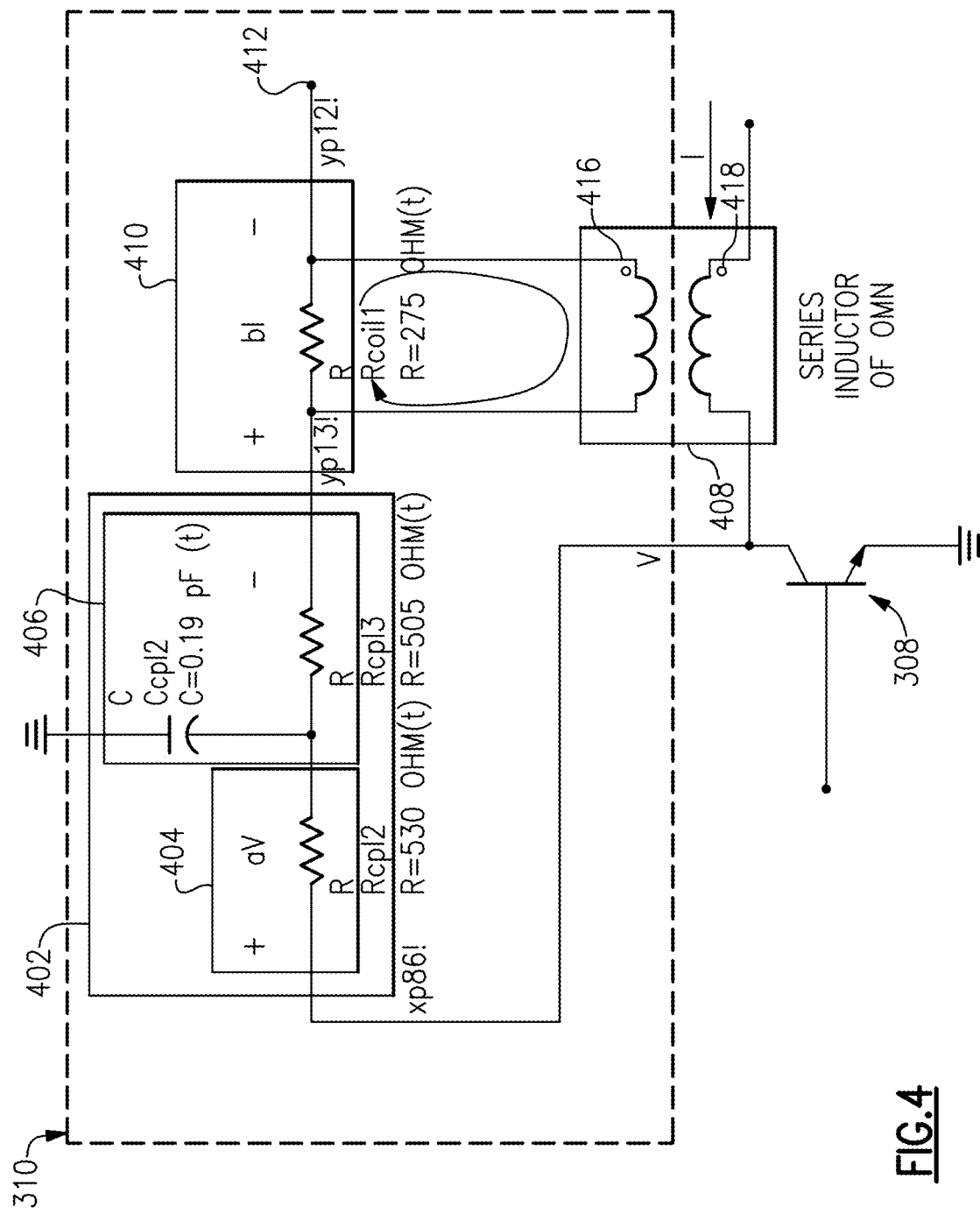
FIG. 4 illustrates an example power detector circuit in accordance with certain aspects of the present disclosure.

FIG. 4 illustrates an example power detector 310 circuit in accordance with certain aspects of the present disclosure. The power detector 30 may be an incident power detector that determines a voltage value indicative of incident power of the power amplifier 308. The power detector 310 may be in communication with a collector of a final stage of a power amplifier 308. To simplify the illustration, only the last stage of the power amplifier 308 is depicted. However, it should be understood that the power amplifier 308 may be a multi-stage power amplifier. Further, there may exist one or more bias circuits or inter-stage matching circuits between stages of the power amplifier 308.

Unlike many conventional power detectors, the power detector 310 measures both a voltage of the power amplifier 308 and an output current of the power amplifier 308. The combination of measurements of the voltage and current of the power amplifier 308 enables the power detector 310 to generate a signal that corresponds to the output power of the power amplifier 308 without using a directional coupler. Further, simulations indicate that the power detector 310 is at least four times more accurate than conventional power detectors.

The power detector 310 includes a voltage sampling circuit 402 that can sample a voltage from the collector of the output stage of the power amplifier 308. Further, the power detector 310 includes a current sampling circuit 408 that can sample a current from the collector of the output stage of the power amplifier 308. Thus, the power detector 310 can sample the voltage (V) and the current (I) flowing out of the power transistor 308. The two measurements obtained by the voltage sampling circuit 402 and the current sampling circuit 408 can be combined to generate a power detection voltage that corresponds to, or is indicative of, the incident power of the power amplifier 308. The output of the power detector 310 is typically not a measure of the incident power itself, but a voltage value that may correspond to or be indicative of the incident power. The incident power can be determined by using, for example, a lookup table that maps the power detector 310 output to the incident power values. Alternatively, the incident power itself is not determined, and instead To combine the voltage of the voltage sampling circuit 402 with the current of the current sampling circuit 408, the sampled current may be converted to a voltage by a current-to-voltage converter 410. The current-to-voltage converter 410 may be implemented as a resistor or as a resistor network comprising a plurality of resistors. The output of the current-to-voltage converter 410 may be combined with the output of the voltage sampling circuit 402 to obtain the power detector signal indicative of the incident power of the power amplifier 308. Combining the output of the current-to-voltage converter 410 with the output of the voltage sampling circuit 402 may include vector adding the two voltages (e.g., the output of the current-to-voltage converter 410 and the output sampled by the voltage sampling circuit 402). This power detector signal may be output at the node 412 and provided to a controller 320 (illustrated in FIG. 3). Assuming the determined incident power of the power amplifier 308 does not match the desired incident power, the controller 320 may modify an RF signal or cause the transceiver 314 to alter the RF signal such that the power amplifier 308 outputs an amplified RF signal at a desired signal strength via the antenna 306.

The power output signal that is output at the node 412 may be provided to a detector front-end that can include a rectifier. This rectifier can convert the signal output by the power detector 310 to a DC voltage signal that is independent of the load at the output of the power amplifier 308. In some cases, the detector front-end is part of the power detector 310. In other cases, the detector front-end may be part of the controller 320.

The voltage sampling circuit 402 may include a voltage sampler 404 and a phase shifter 406. The voltage sampler 404 may include a circuit that can sample the voltage of the power amplifier 308. The phase shifter 406 includes a circuit that can modify that phase of the voltage sampled by the voltage sampler 404. The phase shifter 406 can modify the phase of the sampled voltage to match a phase of the voltage generated by the current-to-voltage converter 410. By matching the phase of the voltages, the two voltage values can be combined without interference constructive or destructive interference between the voltage signal output by the voltage sampler 404 and the voltage signal obtained by the current-to-voltage converter 410, which is based on the current sampled by the current sampler 408.

As previously indicated, a portion of the power detector 310 may be implemented or shared by an output matching network 312. In particular, the current sampler 408 of the power detector 310 may be implemented, in part, using an inductor 418 of the output matching network 312. The current sampler 408 may be implemented as a transformer that can sample current flowing from the power amplifier 308 through the output matching network 312 to the antenna 306. The current sampler 408 may include an inductor 416 that is positioned with respect to an inductor 418 of the output matching network to form the transformer, which can sample the current from the power amplifier 308. This current sampler 408 may replace or serve as a substitute for a coupler that may be positioned before or after an output matching network in certain other implementations of a power detector. Advantageously, by forming the current sampler using elements of the output matching network, the size of the power detector 310 may be reduced compared to implementations that do not share or re-use circuit elements. Further, by sharing circuit elements, the amount of loss that is introduced compared to other power detectors, such as those that are based on a coupler design, is reduced.

Figure 5:
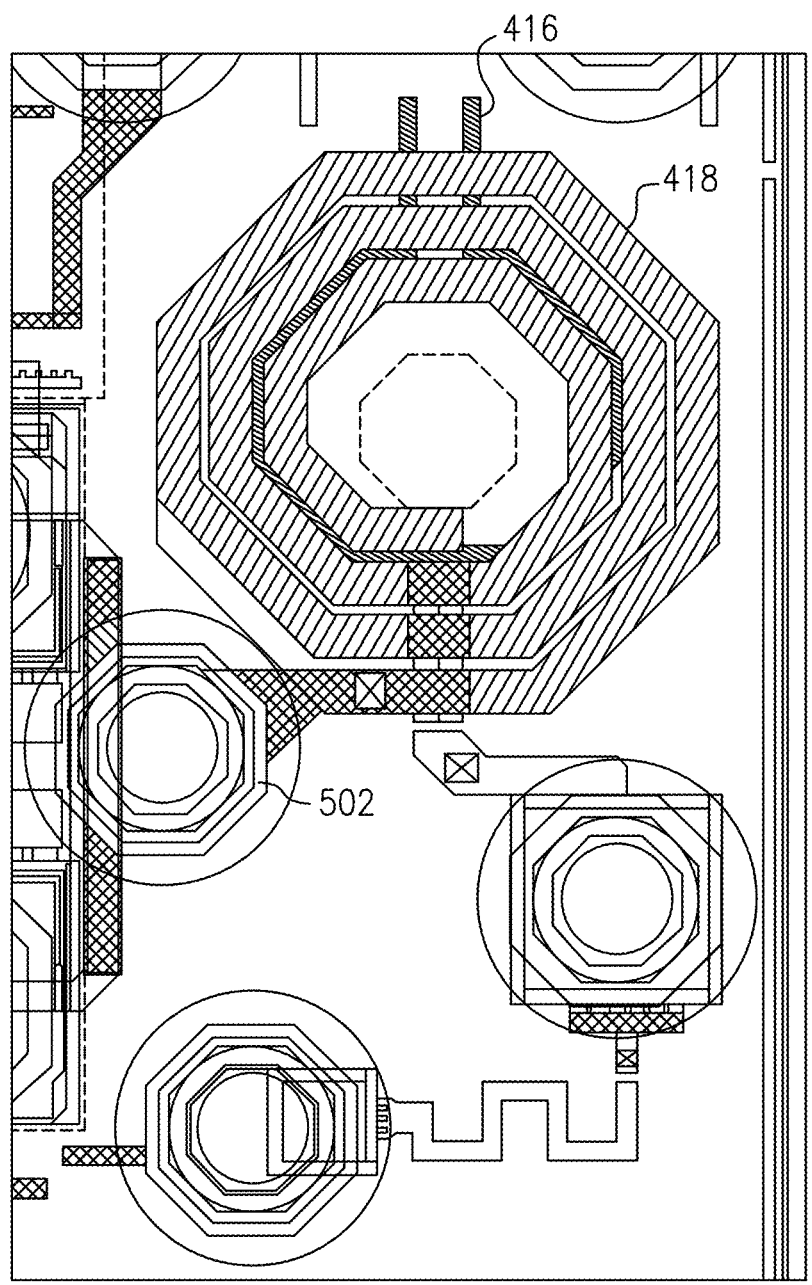
FIG. 5 illustrates an example layout of a portion of the power detector circuit of FIG. 4 in accordance with certain aspects of the present disclosure.

FIG. 5 illustrates an example layout of a portion of the power detector 310 circuit of FIG. 4 in accordance with certain aspects of the present disclosure. The layout illustrates the current sampler 408, and more specifically, the inductors 416 and 418 that form the transformer of the current sampler 408. Further, the octagonal pad 502 represents a collector of the power transistor where sampling of the voltage V and the current I occurs.

Figure 6:
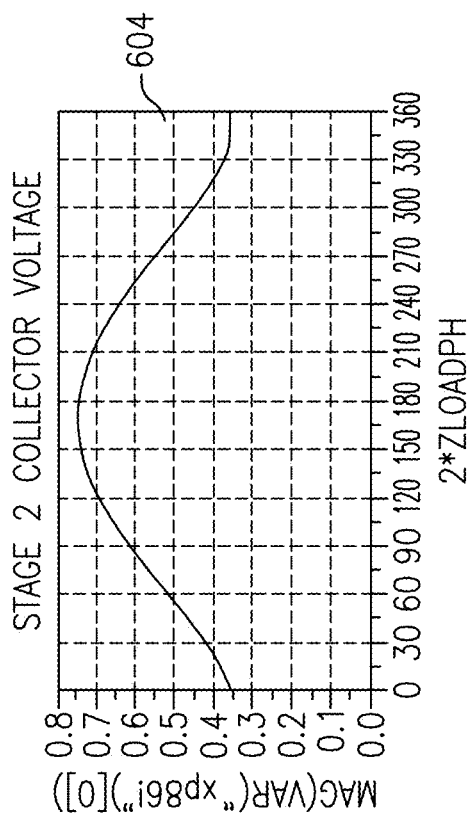
FIG. 6 presents graphs illustrating variation of output as the load on the power amplifier changes and illustrating a constant output at a power detector output using aspects of the present disclosure.
Figure 6:
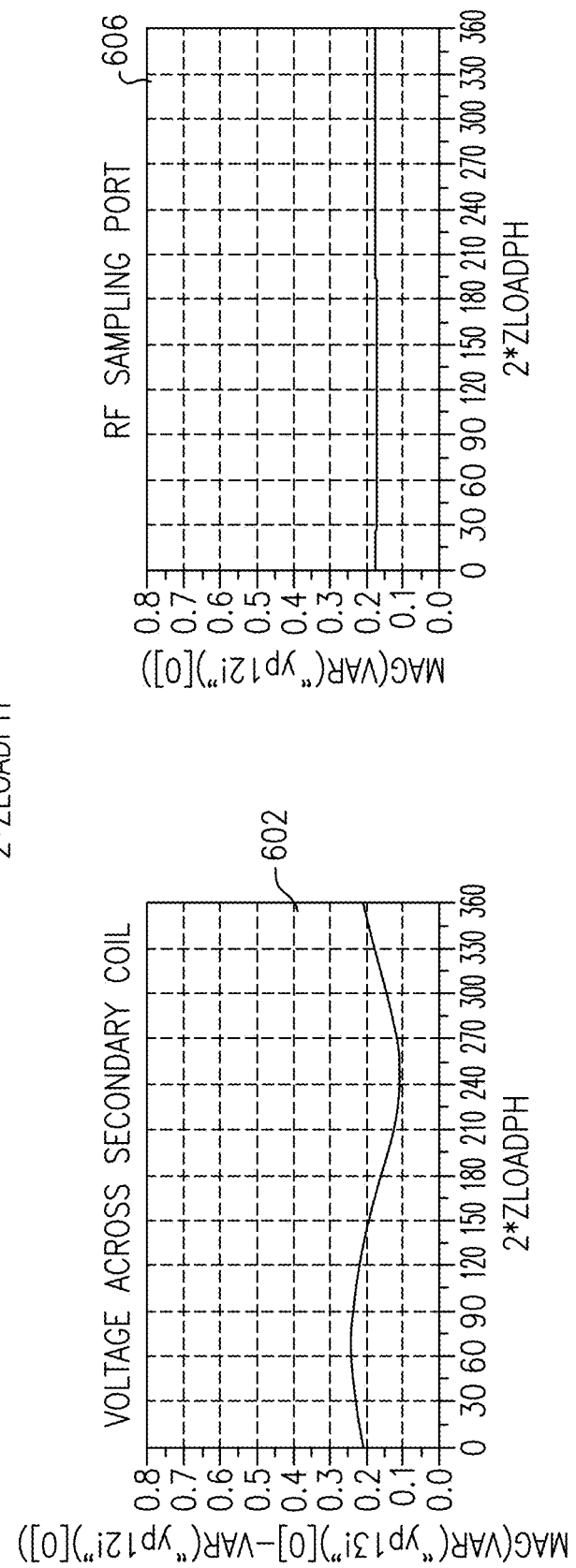

FIGS. 6-12 present a number of simulations illustrating the improvement of the power detector 310 implementing aspects of the present disclosure compared to certain traditional power detectors. FIG. 6 presents graphs illustrating variation of output as the load on the power amplifier changes and illustrating a constant output at a power detector output using aspects of the present disclosure. The graph 602 of FIG. 6 illustrates the relatively strong dependence of the current I as a function of the load phase of the power amplifier. The x-axis indicates the load phase of the power transistor of the power amplifier 308. The y-axis represents the voltage across the secondary coil (bI) or the inductor 416, representing the current of the power transistor of the power amplifier 308. The graph 604 of FIG. 6 illustrates the relatively strong dependence of the voltage V as a function of the load phase of the power amplifier. The x-axis indicates the load phase of the power transistor of the power amplifier 308. The y-axis represents the voltage (aV) at the collector of the power transistor of the power amplifier 308 obtained by the voltage sampler 404. The graph 606 of FIG. 6 illustrates the vectorial addition of aV+bI in a quantity (y-axis) that has a relatively weak dependence (or no dependence) on the load phase. This quantity is a voltage that is sampled by the power detector 310 and represents the incident power exiting the power transistor of the power amplifier 308. Thus, the graph 606 illustrates the ability of embodiments of the present disclosure to perform load insensitive power detection.

Figure 7:
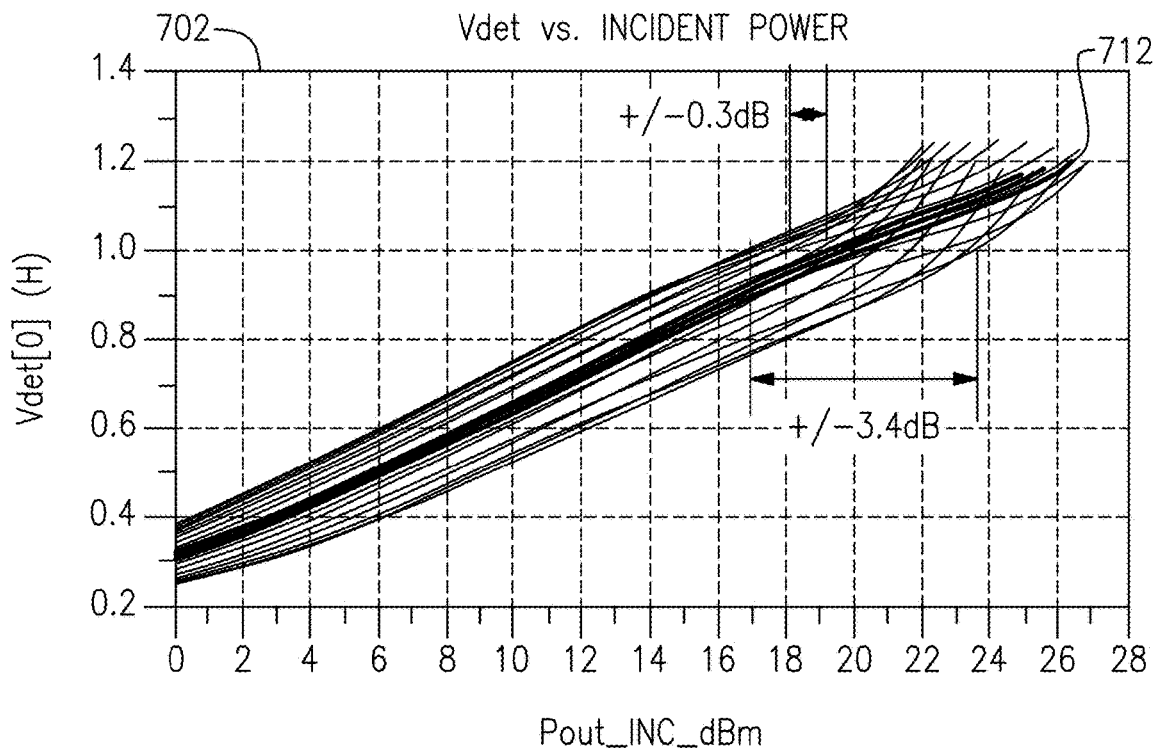
FIG. 7 presents graphs illustrating a comparison between a traditional detector and a power detector implementing aspects of the present disclosure.
Figure 7:
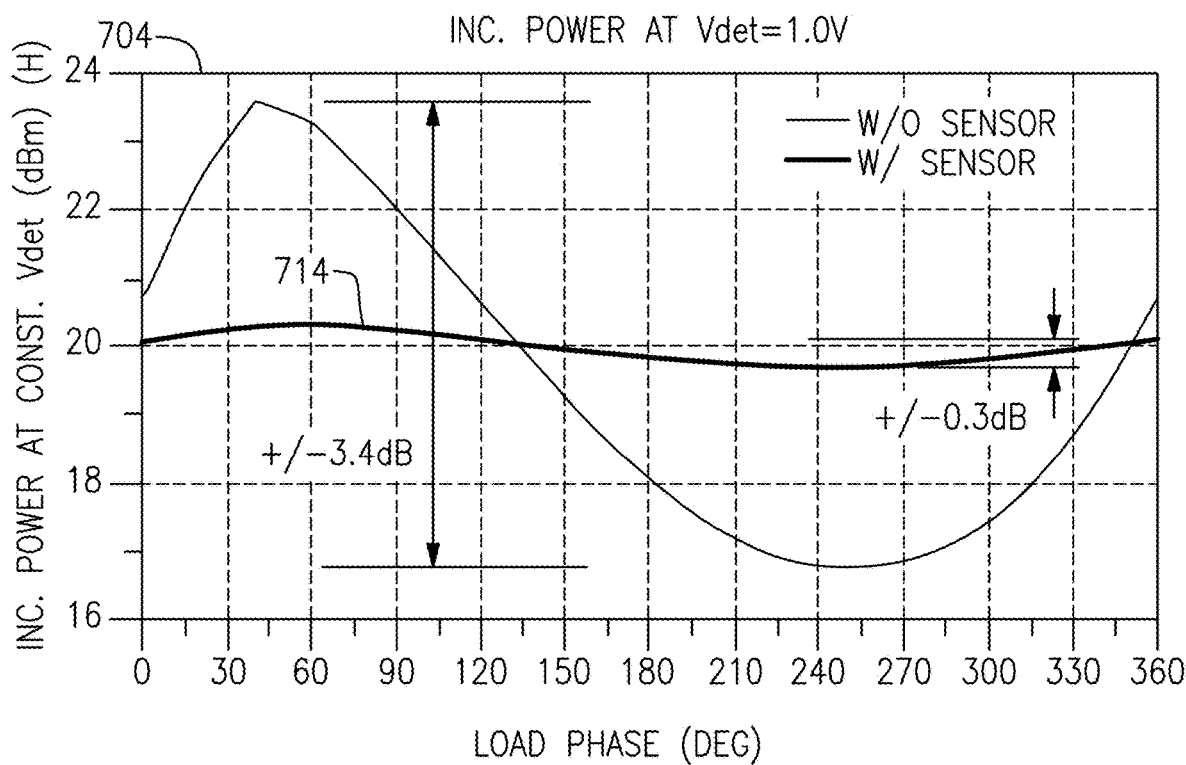

FIG. 7 presents graphs illustrating a comparison between a traditional detector and a power detector implementing aspects of the present disclosure. The graphs 702 and 704 of FIG. 7 correspond to the graphs 202 and 204, respectively, of FIGS. 2A and 2B with the addition of the curves 712 and 714. The curves 712 and 714 represent Vdet and Incident Power when measured with the power detector 310 of the present disclosure. The graphs 702 and 704 illustrate that the Incident Power improves from +/−3.4 dB (power detection without using the embodiments disclosed herein) to +/−0.3 dB using the power detector 310 or power sensor of the present disclosure.

Figure 8:
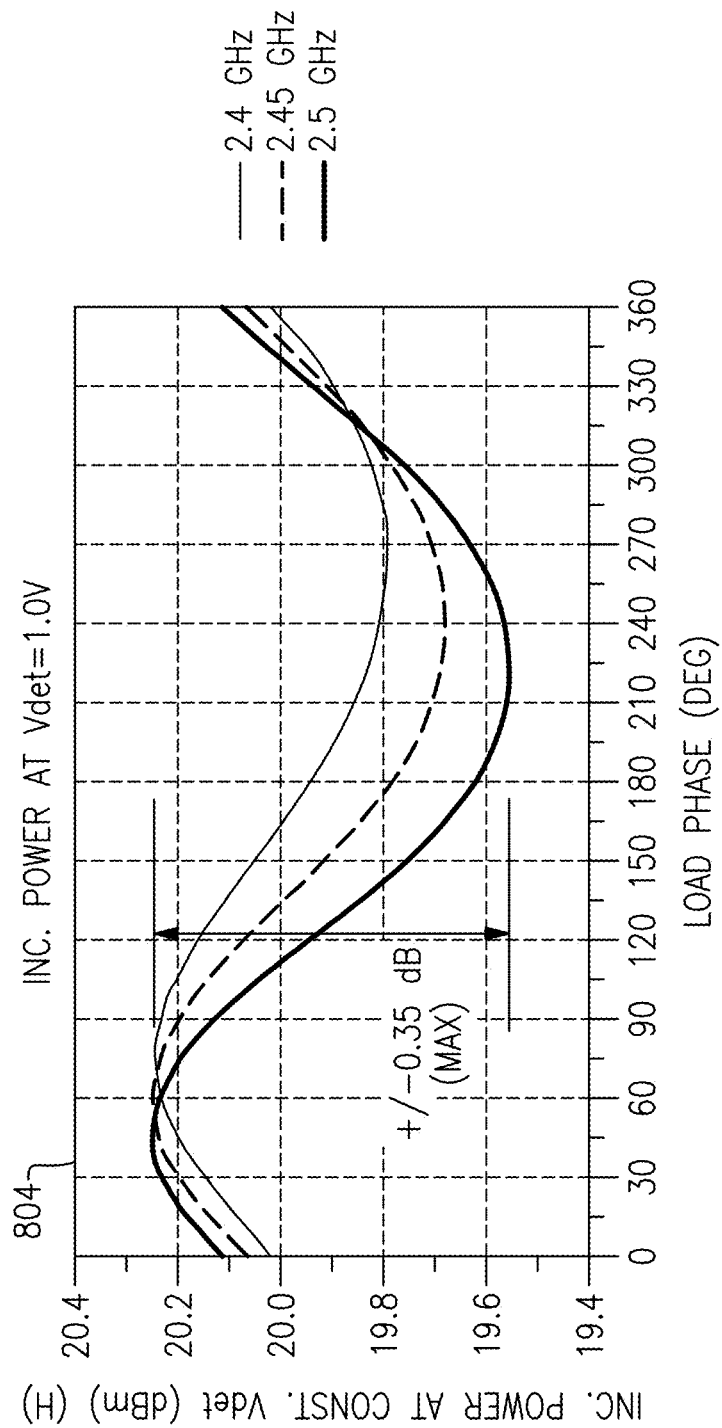
FIG. 8 presents a graph illustrating the output of a power detector implementing aspects of the present disclosure for several frequencies across different loads.

FIG. 8 presents a graph 804 illustrating the output of a power detector implementing aspects of the present disclosure for several frequencies across different loads. The graph 804, similar to the graph 704, illustrates the incident power vs. the load phase at Vdet=1V, but for three different frequencies. As illustrated by the graph 804, the incident power does not vary significantly as frequency changes, illustrating the functionality of the power detector 310 or power sensor of the present disclosure over a wide range of frequencies.

Figure 9:
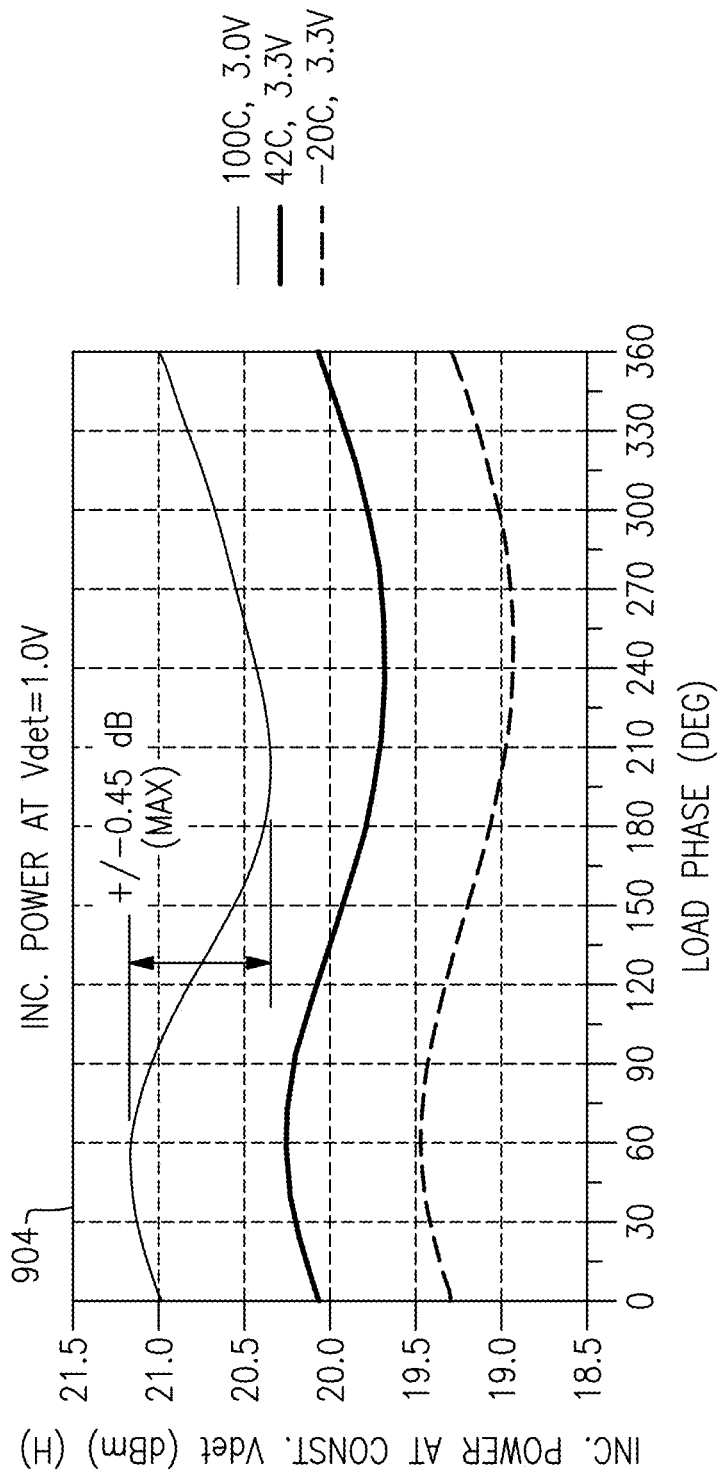
FIG. 9 presents a graph illustrating the output of a power detector implementing aspects of the present disclosure across different temperatures and loads.

FIG. 9 presents a graph 904 illustrating the output of a power detector implementing aspects of the present disclosure across different temperatures and loads. The graph 904, similar to the graph 704, illustrates the incident power vs. the load phase at Vdet=1V, but over a range of voltages and temperatures. As illustrated by the graph 904, the incident power variation does not change significantly as voltage and temperature change, illustrating the functionality of the power detector 310 or power sensor of the present disclosure over voltage and temperature.

Figure 10:
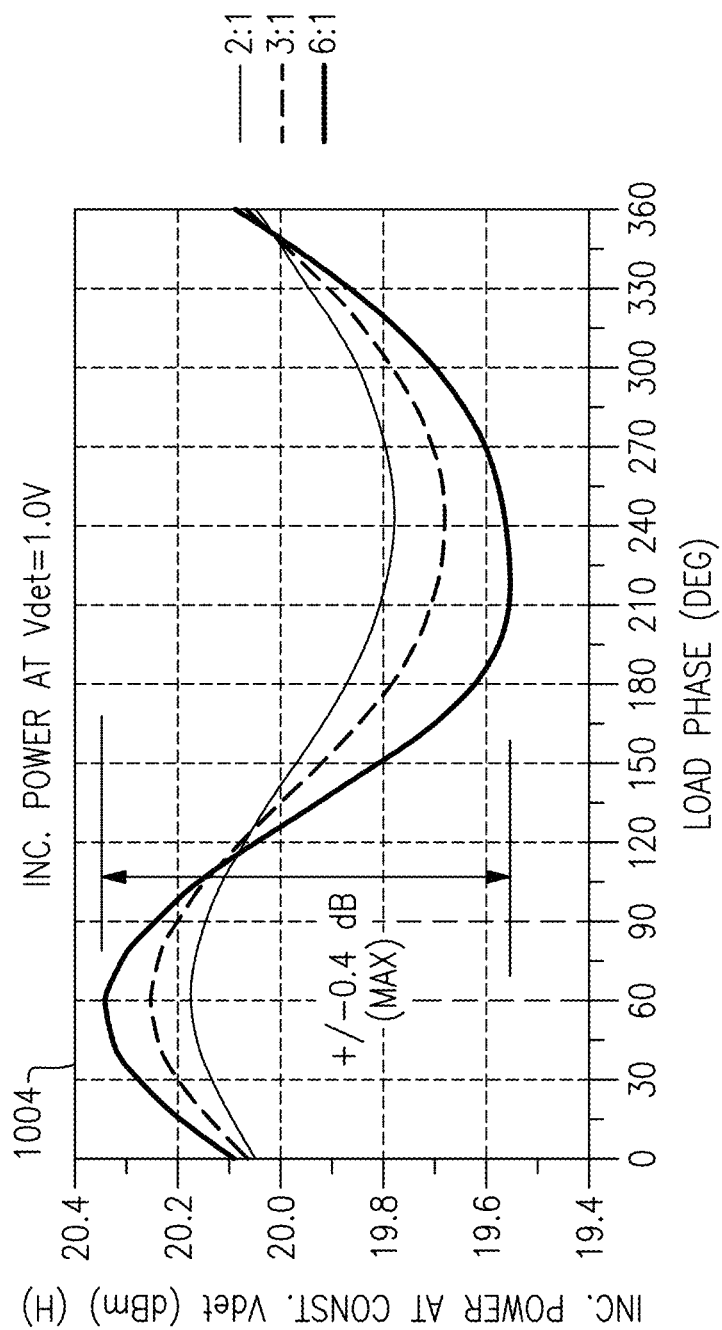
FIG. 10 presents a graph illustrating the output of a power detector implementing aspects of the present disclosure for different mismatch conditions across different loads.

FIG. 10 presents a graph 1004 illustrating the output of a power detector implementing aspects of the present disclosure for different mismatch conditions across different loads. The graph 1004, similar to the graph 704, illustrates the incident power vs. the load phase at Vdet=1V, but over a range of mismatch levels in terms of the voltage standing wave ratio (VSWR). The incident power variation degrades from +/−0.3 dB to +/−0.45 dB as the VSWR increases from 2:1 to 6:1, illustrating the functionality of the power detector 310 or power sensor of the present disclosure over a wide range of mismatch conditions.

Figure 11:
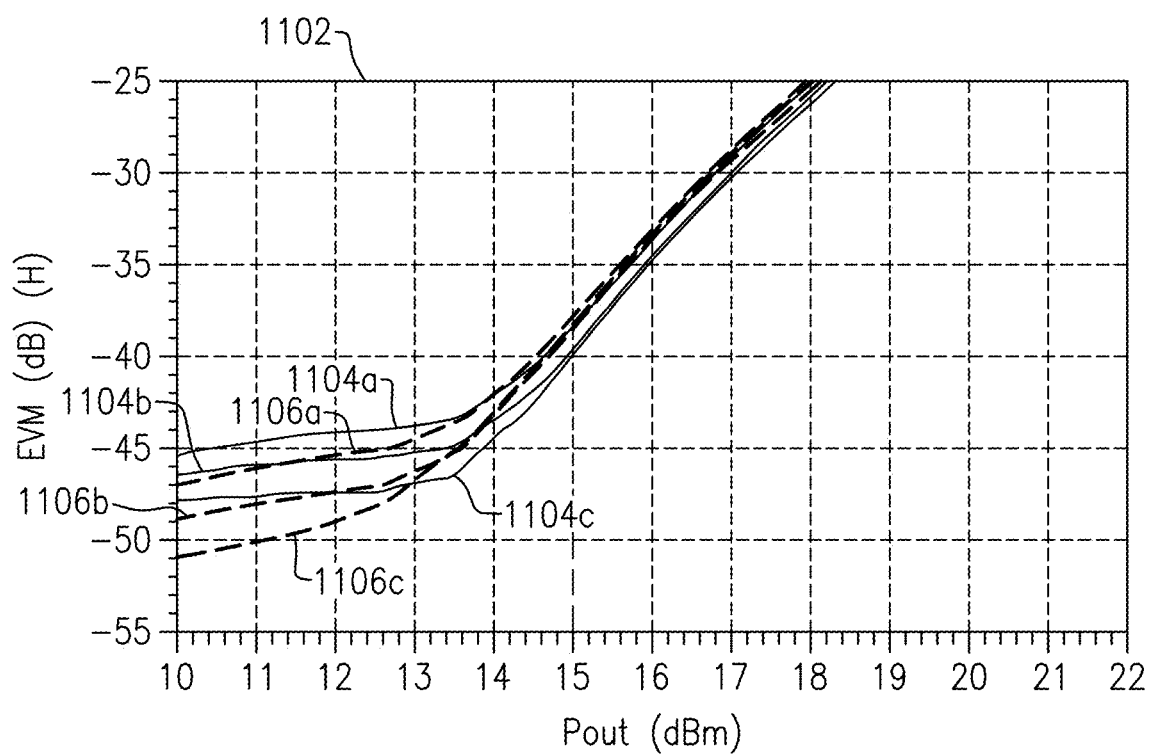
FIG. 11 presents a graph illustrating a comparison between error vector magnitudes for a traditional detector and a power detector implementing aspects of the present disclosure.

FIG. 11 presents a graph 1102 illustrating a comparison between error vector magnitudes for a traditional detector and a power detector implementing aspects of the present disclosure. The y-axis indicates the error vector magnitude (EVM) of the power amplifier 308 as a function of the real output power (x-axis). The curves 1104a, 1104b, and 1104c illustrate a power amplifier without the power detector 310 of the present disclosure. In contrast, the curves 1106a, 1106b, 1106c illustrate a power amplifier 308 incorporating the power detector 310 of the present disclosure. Comparing the curves 1104a-c to the curves 1106a-c illustrates that the incorporation of the power detector 310 does not significantly impact the performance of the power amplifier 308.

Figure 12:
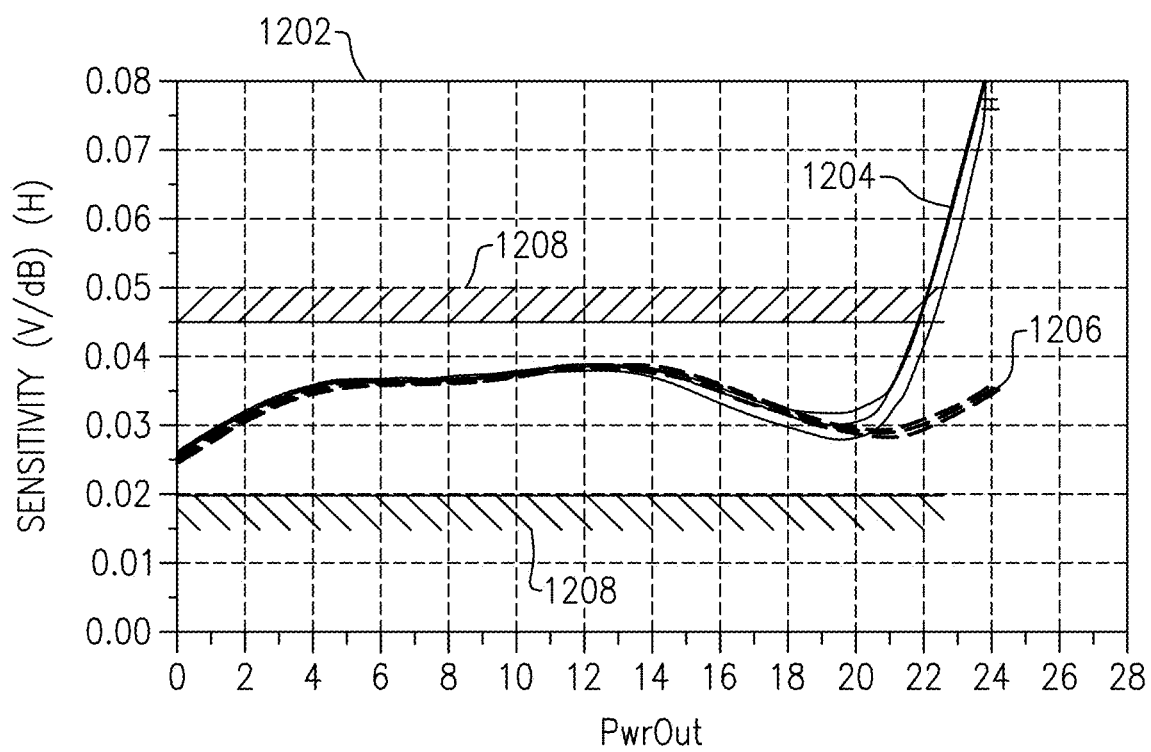
FIG. 12 presents a graph illustrating a power detector sensitivity as a function of the real output power existing a power amplifier in accordance with aspects of the present disclosure.

FIG. 12 presents a graph 1202 illustrating a power detector sensitivity as a function of the real output power existing a power amplifier in accordance with aspects of the present disclosure. The curves 1204 represent the use of power detection without the embodiments disclosed herein. In contrast, the curves 1206 represent the use of power detection using the power detector 310. The bars 1208 represent the sensitivity limits desired for a power detector in accordance with certain example specifications. As illustrated by the graph 1202, the curves 1206 remain within specification limits while the curves 1204 do not. Accordingly, the power detector 310 remains within specification limits and is therefore more robust at high power levels compared to power detection techniques that do not implement aspects of the present disclosure.

Figure 13A:
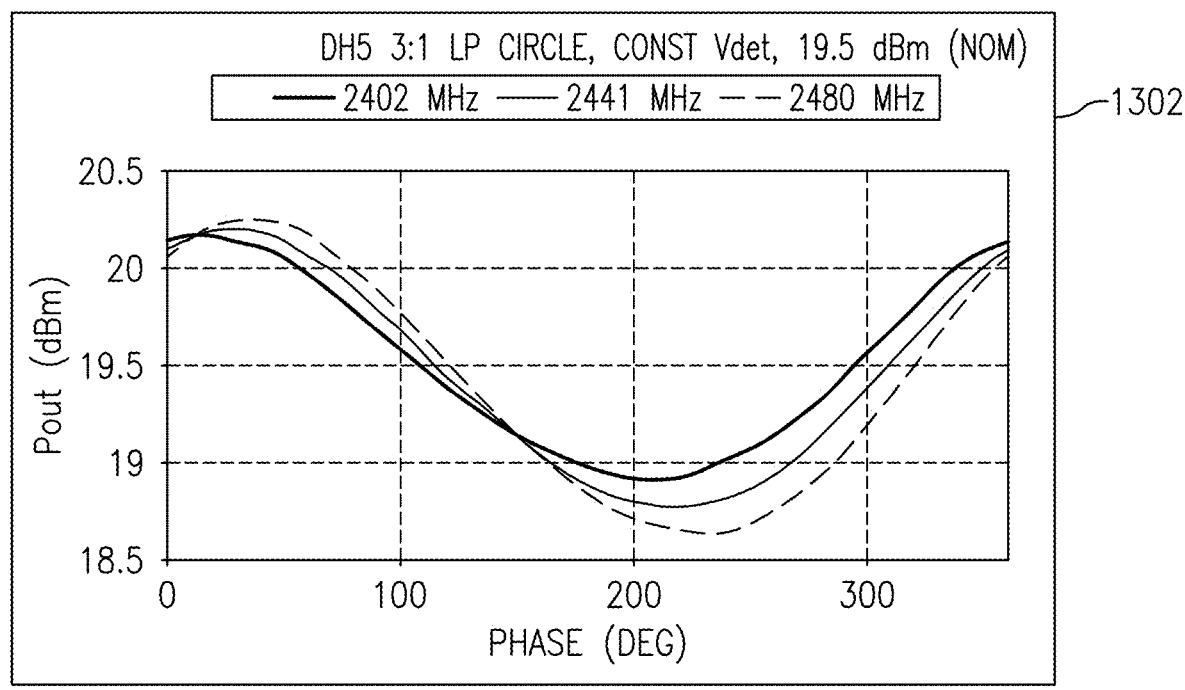
FIG. 13A presents a graph illustrating the output power of a prototype power detector implemented using embodiments of the present disclosure.

In addition to the simulations illustrated in FIGS. 6-12, tests were performed on a prototype that illustrate and confirm the advantages of embodiments of the present disclosure over conventional power detectors that do not implement the embodiments disclosed herein. FIG. 13A presents a graph 1302 illustrating the output power of a prototype power detector implemented using embodiments of the power detector 310 of the present disclosure. The graph 1302 illustrates the output power measurements for three different frequencies. FIG. 13B presents a table 1304 of measured values obtained during testing of the prototype power detector 310. The table indicates that the maximum power variation across the tested frequency values when the prototype power detector based on embodiments of the power detector 310 is used is +/−0.81 dB. In contrast, certain conventional power detectors have a power variation of +/−1.76 dB.

Terminology

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A load-insensitive power detector comprising:
a voltage sampling circuit configured to sample a first voltage from a power amplifier;
a current sampling circuit configured to sample an output current from the power amplifier, the current sampling circuit including a transformer formed from a first inductor of an output matching network that is aligned with a second inductor that is separate from the output matching network; and
a power detection circuit configured to generate a detector voltage corresponding to an incident power of the power amplifier based at least in part on the first voltage and the output current.

2. The load-insensitive power detector of claim 1 wherein a combination of the first voltage and the output current enables omission of a directional coupler from the load-insensitive power detector.

3. The load-insensitive power detector of claim 1 wherein the power detection circuit includes a current-to-voltage converter configured to convert the output current to obtain a second voltage.

4. The load-insensitive power detector of claim 3 wherein the power detection circuit generates the detector voltage by combining the first voltage and the second voltage.

5. The load-insensitive power detector of claim 3 wherein the current-to-voltage converter is positioned between the voltage sampling circuit and an output of the load-insensitive power detector.

6. The load-insensitive power detector of claim 1 wherein the voltage sampling circuit and the current sampling circuit are connected to a collector of the power amplifier.

7. The load-insensitive power detector of claim 6 wherein the power amplifier is a multi-stage power amplifier and the collector is of an output stage of the power amplifier.

8. The load-insensitive power detector of claim 1 wherein the current sampling circuit includes a portion of an output matching network connected to a collector of the power amplifier.

9. The load-insensitive power detector of claim 1 wherein the voltage sampling circuit includes a voltage sampler configured to sample a third voltage and a phase shifter configured to adjust a phase of the third voltage to obtain the first voltage.

10. The load-insensitive power detector of claim 9 wherein the phase shifter adjusts the phase of the third voltage to match a phase of a second voltage obtained from the output current.

11. The load-insensitive power detector of claim 1 further comprising a detector front-end that includes a rectifier configured to convert the detector voltage to a direct current voltage signal.

12. A front-end module comprising:
a power amplifier configured to amplify a transmit signal; and
a power detector including a voltage sampling circuit, a current sampling circuit, and a power detection circuit, the voltage sampling circuit configured to sample a first voltage from the power amplifier, the current sampling circuit configured to sample an output current from the power amplifier, the current sampling circuit including a transformer formed from a first inductor of an output matching network that is aligned with a second inductor that is separate from the output matching network, and the power detection circuit configured to generate a detector voltage corresponding to an incident power of the power amplifier based at least in part on the first voltage and the output current.

13. The front-end module of claim 12 further comprising an output matching network configured to match an impedance of the power amplifier to an antenna impedance.

14. The front-end module of claim 13 wherein a portion of the current sampling circuit is formed from a portion of the output matching network.

15. The front-end module of claim 12 wherein the detector voltage is independent of a load on the power amplifier.

16. The front-end module of claim 12 wherein the power detection circuit includes a current-to-voltage converter configured to convert the output current to obtain a second voltage and the detector voltage is generated by combining the first voltage and the second voltage.

17. The front-end module of claim 12 wherein the voltage sampling circuit includes a voltage sampler configured to sample a third voltage and a phase shifter configured to adjust a phase of the third voltage to obtain the first voltage and match a phase of a second voltage obtained from the output current.

18. A wireless device comprising:
an antenna configured to transmit a signal; and
a front-end module configured to provide the signal to the antenna, the front-end module including a power amplifier configure to amplify the signal and a power detector, the power detector including a voltage sampling circuit, a current sampling circuit, and a power detection circuit, the voltage sampling circuit configured to sample a first voltage from the power amplifier, the current sampling circuit configured to sample an output current from the power amplifier, the current sampling circuit including a transformer formed from a first inductor of an output matching network that is aligned with a second inductor that is separate from the output matching network, and the power detection circuit configured to generate a detector voltage corresponding to an incident power of the power amplifier based at least in part on the first voltage and the output current.

19. The wireless device of claim 18 wherein the front-end module further includes an output matching network configured to match an impedance of the power amplifier to an antenna impedance of the antenna.

20. The wireless device of claim 18 wherein the power detection circuit includes a current-to-voltage converter configured to convert the output current to obtain a second voltage and the detector voltage is generated by combining the first voltage and the second voltage.

* * * * *